(12) United States Patent
Enkovaara

(10) Patent No.: US 10,274,304 B2
(45) Date of Patent: Apr. 30, 2019

(54) METHOD FOR CONTROLLING AN ELECTRICAL DEVICE AND AN ELECTRICAL DEVICE

(71) Applicant: CORIANT OY, Naperville, IL (US)

(72) Inventor: Kim Enkovaara, Espoo (FI)

(73) Assignee: CORIANT OY, Espoo (FI)

( * ) Notice: Subject to any disclaimer, the term of this patent is extended or adjusted under 35 U.S.C. 154(b) by 787 days.

(21) Appl. No.: 14/259,287

(22) Filed: Apr. 23, 2014

(65) Prior Publication Data

US 2014/0320114 A1  Oct. 30, 2014

(30) Foreign Application Priority Data

Apr. 24, 2013 (FI) ..................................... 20135421

(51) Int. Cl.
    *G01B 7/00*    (2006.01)
    *G01R 33/00*   (2006.01)
    (Continued)

(52) U.S. Cl.
    CPC .............. *G01B 7/003* (2013.01); *G01R 33/00* (2013.01); *G01R 33/007* (2013.01);
    (Continued)

(58) Field of Classification Search
    CPC ...... G01B 7/003; G01R 33/007; G01R 33/07; G01R 33/09; G05B 19/042;
    (Continued)

(56) References Cited

U.S. PATENT DOCUMENTS 4,245,309 A * 1/1981 Kiefer ............... G05B 19/0426
                                                  134/57 D
6,973,026 B1 12/2005 Dyrga et al.
(Continued)

FOREIGN PATENT DOCUMENTS

| EP | 2447675    | 5/2012  |
|----|------------|---------|
| WO | 03074969   | 9/2003  |
| WO | 2012018828 | 2/2012  |

OTHER PUBLICATIONS

European Search Report dated Apr. 30, 2015, corresponding to the Foreign Priority Application No. 14 16 4922.8.
(Continued)

*Primary Examiner* — Jianxun Yang
(74) *Attorney, Agent, or Firm* — Young & Thompson

(57) ABSTRACT

An electrical device includes a magnetic sensor circuitry (101) for detecting magnetic field and for generating a detection signal in response to the detected magnetic field, and a control circuitry (102) for controlling operation of the electrical device in accordance with the detection signal. The magnetic sensor circuitry is configured to detect a direction related to a deviation of the magnetic field from the magnetic field of the earth, and the control circuitry is configured to control the operation of the electrical device in accordance with the detected direction. The electrical device can be controlled by using e.g. a permanent magnet (105) for directing, to the magnetic sensor circuitry, magnetic field deviating from the magnetic field of the earth and having a desired orientation. Thus, the electrical device can be controlled without an electrical connector or a radio interface.

5 Claims, 3 Drawing Sheets

(51) Int. Cl.
    *G01R 33/07* (2006.01)
    *G01R 33/09* (2006.01)
    *G05B 19/042* (2006.01)
(52) U.S. Cl.
    CPC .......... *G01R 33/0047* (2013.01); *G01R 33/07* (2013.01); *G01R 33/09* (2013.01); *G05B 19/042* (2013.01); *G05B 2219/25313* (2013.01)
(58) Field of Classification Search
    CPC ............ G05B 19/0426; G05B 19/0428; G01D 5/145; H01H 2025/045; H01H 2239/024; H03K 17/97; H04N 1/00413; H04N 2101/00; A47L 15/0063; Y02B 40/143; G06F 11/2273
    See application file for complete search history.

(56) References Cited

U.S. PATENT DOCUMENTS

| | | | |
|---|---|---|---|
| 8,402,664 | B1 | 3/2013 | Kitamura et al. |
| 8,468,898 | B2 | 6/2013 | Baller et al. |
| 2004/0204779 | A1* | 10/2004 | Mueller ............... A61H 33/005 700/83 |
| 2005/0278147 | A1* | 12/2005 | Morton ............... G06F 11/2273 702/183 |
| 2007/0082677 | A1 | 4/2007 | Donald et al. |
| 2008/0103610 | A1* | 5/2008 | Ebrom .................. D06F 39/005 700/29 |
| 2010/0307016 | A1 | 12/2010 | Mayor et al. |
| 2012/0069165 | A1* | 3/2012 | Choi .................. H04N 1/00413 348/61 |
| 2012/0103111 | A1 | 5/2012 | Baller et al. |
| 2012/0153936 | A1 | 6/2012 | Romani et al. |
| 2012/0166122 | A1 | 6/2012 | Bottinelli et al. |
| 2012/0181958 | A1 | 7/2012 | Chabaud |
| 2012/0210562 | A1 | 8/2012 | Jones et al. |
| 2012/0265913 | A1* | 10/2012 | Suumaki ............... H04W 4/008 710/303 |
| 2013/0064175 | A1* | 3/2013 | Pandey ................. H04W 8/005 370/328 |
| 2013/0096825 | A1 | 4/2013 | Mohanty |

OTHER PUBLICATIONS

Finnish Search Report dated Feb. 18, 2014, corresponding to the Foreign Priority Application No. 20135421.

* cited by examiner

METHOD FOR CONTROLLING AN ELECTRICAL DEVICE AND AN ELECTRICAL DEVICE

FIELD OF THE INVENTION

The invention relates generally to delivering control information to an electrical device that can be, for example but not necessarily, a network element such as a router. More particularly, the invention relates to a method for controlling an electrical device and to an electrical device. Furthermore, the invention relates to a computer program for controlling an electrical device.

BACKGROUND

In many cases there is a need to deliver control information to an electrical device. The control information can be needed, for example, to switch the electrical device from one operational mode to another operational mode. The operational modes of the electrical device may comprise, for example, a normal operation mode, a self-test mode, an interactive testing mode when a test procedure is run in cooperation with another device, a production line testing mode, a standby mode, and/or a configuration mode. The electrical device can be, for example but not necessarily, a network element of a data transfer network. The network element can be, for example, an Internet Protocol "IP" router, an Ethernet switch, an Asynchronous Transfer Mode "ATM" switch, and/or a MultiProtocol Label Switching "MPLS" switch.

In many cases, an electrical device has to be capable of operating in so demanding circumstances that a watertight or even gastight casing is needed for protecting functional elements of the electrical device against ambient conditions such as moisture. Also in cases of the kind mentioned above, there can be a need to deliver, from outside the casing, control information to the functional elements located inside the casing. It is possible to provide the casing with one or more electrical connectors through which the control information can be transferred to the functional elements. An inconvenience related to an arrangement based on the electrical connector is the need for one or more sealed lead-ins and the risk that ambient conditions, such as moisture, damage the electrical connector. It is also possible to provide the electrical device with a radio receiver located inside the casing and configured to receive the control information and to forward the control information to the functional elements. An inconvenience related to an arrangement based on the radio receiver is the need to take care that a received radio signal carrying the control information does not disturb the operation of the functional elements. Furthermore, there has to be a radio transmitter in a device for transmitting the control information. Thus, the device for transmitting the control information is inherently quite complex.

SUMMARY

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the invention, there is provided a new electrical device that can be, for example but not necessarily, a network element such as a switch or a router. An electrical device according to the invention comprises:
- a magnetic sensor circuitry for detecting magnetic field and for generating a detection signal in response to the detected magnetic field, and
- a control circuitry configured to receive the detection signal from the magnetic sensor circuitry and to control operation of the electrical device in accordance with the detection signal.

The magnetic sensor circuitry is configured to detect a direction related to a deviation of the magnetic field from the magnetic field of the earth, and the control circuitry is configured to control the operation of the electrical device in accordance with the detected direction related to the deviation of the magnetic field from the magnetic field of the earth. The electrical device can be controlled by using e.g. a permanent magnet for directing, to the magnetic sensor circuitry, magnetic field that deviates from the magnetic field of the earth and has a desired direction. Thus, the electrical device can be controlled without an electrical connector or a radio interface. A control device for transmitting the control information can be merely a piece of permanent magnet material, and thus the control device can be very simple.

In accordance with the invention, there is provided also a new method for controlling an electrical device. A method according to the invention comprises:
- detecting magnetic field,
- generating a detection signal in response to the detected magnetic field, and
- controlling operation of the electrical device in accordance with the detection signal.

The detection of the magnetic field comprises detecting a direction related to a deviation of the magnetic field from the magnetic field of the earth, and the control of the operation of the electrical device comprises controlling the operation of the electrical device in accordance with the detected direction related to the deviation of the magnetic field from the magnetic field of the earth.

In accordance with the invention, there is provided also a new network element that comprises:
- a transceiver for receiving data from a data transfer network and for transmitting data to the data transfer network,
- a processing system for controlling the network element and for running one or more communication protocols, and
- an electrical device according to the invention for controlling the processing system in accordance with magnetic field directed to the magnetic sensor circuitry of the electrical device.

The network element can be, for example but not necessarily, an Internet Protocol "IP" router, an Ethernet switch, an Asynchronous Transfer Mode "ATM" switch, and/or a MultiProtocol Label Switching "MPLS" switch.

The electrical device of the network element is configured to produce a first control instruction in response to detection of a first direction related to the deviation of the magnetic field from the magnetic field of the earth, and the processing system is configured to control, in response to the first control instruction, the transceiver to:
- send, out from the network element to the data transfer network, a message requesting configuration data related to the one or more communication protocols, and receive, from the data transfer network outside the network element, the configuration data.

In accordance with the invention, there is provided also a new computer program for controlling an electrical device that comprises:
- a magnetic sensor circuitry for detecting magnetic field and for generating a detection signal in response to the detected magnetic field, the magnetic sensor circuitry being configured to detect a direction related to a deviation of the magnetic field from the magnetic field of the earth, and
- a programmable processor for receiving the detection signal from the magnetic sensor circuitry.

A computer program according to the invention comprises computer executable instructions for controlling the programmable processor to control the operation of the electrical device in accordance with the detected direction related to the deviation of the magnetic field from the magnetic field of the earth.

A computer program product according to the invention comprises a non-volatile computer readable medium, e.g. a compact disc ("CD"), encoded with a computer program according to the invention.

A number of non-limiting and exemplifying embodiments of the invention are described in accompanied dependent claims.

Various non-limiting and exemplifying embodiments of the invention both as to constructions and to methods of operation, together with additional objects and advantages thereof, will be best understood from the following description of specific exemplifying embodiments when read in connection with the accompanying drawings.

The verbs "to comprise" and "to include" are used in this document as open limitations that neither exclude nor require the existence of unrecited features. The features recited in depending claims are mutually freely combinable unless otherwise explicitly stated. Furthermore, it is to be understood that the use of "a" or "an", i.e. a singular form, throughout this document does not exclude a plurality.

BRIEF DESCRIPTION OF FIGURES

Exemplifying embodiments of the invention and their advantages are explained in greater detail below in the sense of examples and with reference to the accompanying drawings, in which.

DESCRIPTION OF EXEMPLIFYING EMBODIMENTS

Figure 1A:
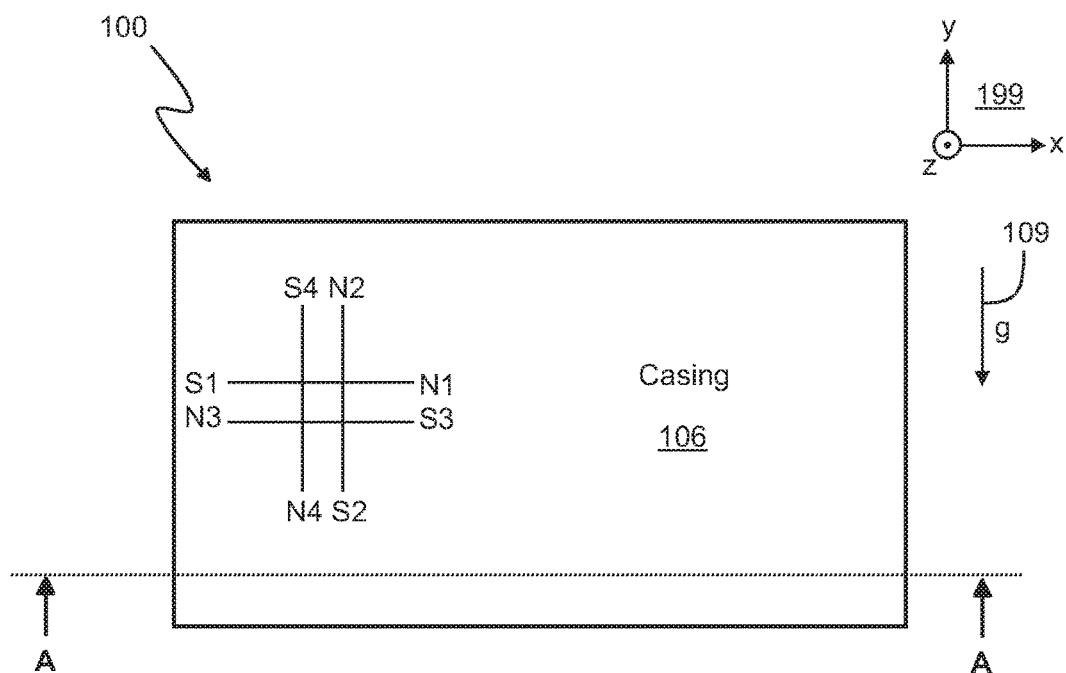
FIGS. 1a and 1b illustrate an electrical device according to an exemplifying embodiment of the invention.
Figure 1B:
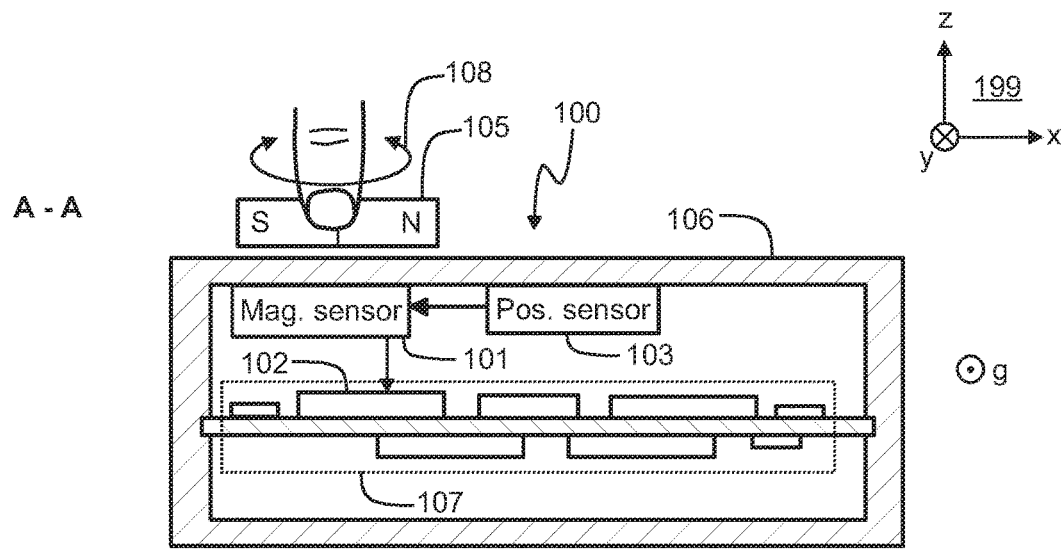

FIGS. 1a and 1b illustrate an electrical device 100 according to an exemplifying embodiment of the invention. FIG. 1b shows a view of a section taken along a line A-A shown in FIG. 1a. The section plane is parallel with the xz-plane of a coordinate system 199. The electrical device comprises functional elements 107 that are protected against ambient conditions with the aid of a casing 106. The electrical device comprises a magnetic sensor circuitry 101 for detecting magnetic field and for generating a detection signal in response to the detected magnetic field. In the exemplifying case illustrated in FIGS. 1a and 1b, the magnetic sensor circuitry 101 is located on an inner surface of a wall of the casing 106. One of the functional elements 107 is a control circuitry 102 that is configured to receive the detection signal from the magnetic sensor circuitry 101 and to control the operation of the electrical device in accordance with the detection signal. The magnetic sensor circuitry 101 is configured to detect a direction related to a deviation of the magnetic field from the magnetic field of the earth. The above-mentioned deviation means a difference between the total magnetic field prevailing at the magnetic sensor circuitry and the magnetic field of the earth prevailing at the magnetic sensor circuitry. The control circuitry 102 is configured to control the operation of the electrical device in accordance with the detected direction related to the deviation of the magnetic field from the magnetic field of the earth. The magnetic sensor circuitry 101 comprises advantageously a two- or three-axis magnetometer that can be a Hall-effect magnetometer, a magnetoresistive magnetometer, or some other suitable magnetometer. Furthermore, the magnetic sensor circuitry may comprise a logical and/or processing circuit for generating the above-mentioned detection signal on the basis of output signals of the two- or three-axis magnetometer.

The electrical device can be controlled by using e.g. a permanent magnet 105 for directing, to the magnetic sensor circuitry 101, magnetic field that deviates from the magnetic field of the earth and has a desired direction. Thus, the electrical device can be controlled without an electrical connector or a radio interface. The control of the electrical device can comprise, for example, switching the electrical device from one operational mode to another operational mode. The operational modes of the electrical device may comprise, for example, a normal operation mode, a self-test mode, an interactive testing mode when a test procedure is run in cooperation with another device, a production line testing mode, a standby mode, and/or a configuration mode.

In an electrical device according to an exemplifying embodiment of the invention, the magnetic sensor circuitry 101 is configured to detect strength of the magnetic field, to compare the strength to a threshold value, and to detect a direction of the magnetic field. A situation in which the detected strength of the magnetic field exceeds a suitably selected threshold value is indicative of a situation in which the magnetic field prevailing at the magnetic sensor circuitry 101 deviates from the magnetic field of the earth, i.e. the magnetic field has a component produced by the permanent magnet 105 or by another device for producing magnetic field. In this case, the direction of the magnetic field prevailing at the magnetic sensor circuitry represents the direction that is related to the deviation of the magnetic field from the magnetic field of the earth. It is worth noting that the above-mentioned direction is not exactly, but only related to, the direction of the magnetic field caused by e.g. the permanent magnet 105 because the magnetic field of the earth constitutes a component of the magnetic field prevailing at the magnetic sensor circuitry.

In an electrical device according to an exemplifying embodiment of the invention, the magnetic sensor circuitry 101 is configured to detect a change of the magnetic field and to detect a direction of the change of the magnetic field. In this exemplifying case, the change of the magnetic field represents the deviation from the magnetic field of the earth and the direction of the change of the magnetic field represents the direction related to the deviation of the magnetic field from the magnetic field of the earth. The magnetic field prevailing at the magnetic sensor circuitry 101 changes when the distance between the permanent magnet 105 and the magnetic sensor circuitry 101 is changed and/or the posture, i.e. orientation, of the permanent magnet is changed. The magnetic sensor circuitry 101 may comprise a memory for storing previous detection results and a control logic for producing the detection signal so that each value of the detection signal corresponds to a change exceeding a predetermined threshold and having a predetermined direction. It is also possible that the control circuitry 102 comprises the above-mentioned memory and/or the control logic. The magnetic sensor circuitry 101 and the control circuitry 102 can be configured, for example, so that control information can be delivered to the electrical device by bringing the permanent magnet 105 to the position shown in FIG. 1*b* and then rotating the permanent magnet as illustrated by an arched arrow 108.

In an electrical device according to an exemplifying embodiment of the invention, the magnetic sensor circuitry 101 is configured to detect the direction related to the deviation of the magnetic field from the magnetic field of the earth with respect to a reference direction fixed to the electrical device. In the exemplifying case illustrated in FIGS. 1*a* and 1*b*, a surface of the casing 106 is provided with markings N1-S1, N2-S2, N3-S3, and N4-S4. The magnetic sensor circuitry 101 and the control circuitry 102 can be configured for example so that a first control action is generated when the north "N" and south "S" poles of the permanent magnet 105 are aligned with the marking N1-S1, a second control action is generated when the north and south poles are aligned with the marking N2-S2, a third control action is generated when the north and south poles are aligned with the marking N3-S3, and a fourth control action is generated when the north and south poles are aligned with the marking N4-S4. One or more of the control actions can, for example, such that the electrical device is controlled to switch from one operation mode to another operation mode.

An electrical device according to an exemplifying embodiment of the invention comprises a positional sensor 103 for indicating the orientation of the electrical device with respect to the earth and the magnetic sensor circuitry 101 is configured to detect the direction related to the deviation of the magnetic field from the magnetic field of the earth with respect to a reference direction fixed to the earth. In this case, the posture of the permanent magnet 105 with respect to the earth determines the control actions delivered to the electrical device and thereby the control actions are independent of the posture of the electrical device with respect to the earth. The reference direction fixed to the earth can be e.g. the direction of gravity that is illustrated with an arrow 109 in FIG. 1*a*. The magnetic sensor circuitry 101 and the control circuitry 102 can be configured for example so that a first control action is generated when the north "N" pole of the permanent magnet 105 is upwards, i.e. against the direction of gravity, and the south "S" pole is downwards, and a second control action is generated when the north pole is downwards and the south pole is upwards.

In an electrical device according to an exemplifying embodiment of the invention, the magnetic sensor circuitry 101 is configured to detect a vertical component of the magnetic field, to compare the vertical component to a threshold value, and to detect a direction of the magnetic field. When the electrical device is located sufficiently far from the magnetic poles of the earth, a situation in which the vertical component of the magnetic field exceeds a suitably selected threshold value is indicative of a situation in which the magnetic field prevailing at the magnetic sensor circuit 101 deviates from the magnetic field of the earth, i.e. the magnetic field has a component produced by the permanent magnet 105 or by another device for producing magnetic field. The electrical device may comprise a positional sensor for indicating the orientation of the electrical device with respect to the earth so as to enable the magnetic sensor circuitry 101 to detect the vertical component of the magnetic field. It is also possible that there is no positional sensor but in this case the electrical device has to be positioned in a predetermined manner with respect to the earth so as to enable the magnetic sensor circuitry 101 to detect the vertical component of the magnetic field.

FIGS. 1*a* and 1*b* illustrate a case where the control device for producing magnetic field, e.g. the permanent magnet 105, is a separate part with respect to the electrical device 100. It is also possible to attach e.g. a permanent magnet rotatably to an outer wall of the casing 106 so that different control information can be delivered to the functional elements 107 by turning the permanent magnet. It is also possible to provide the wall of the casing with one or more windings so that different control information can be delivered to the functional elements 107 by supplying electrical current or currents to the one or more windings in different ways.

Figure 2:
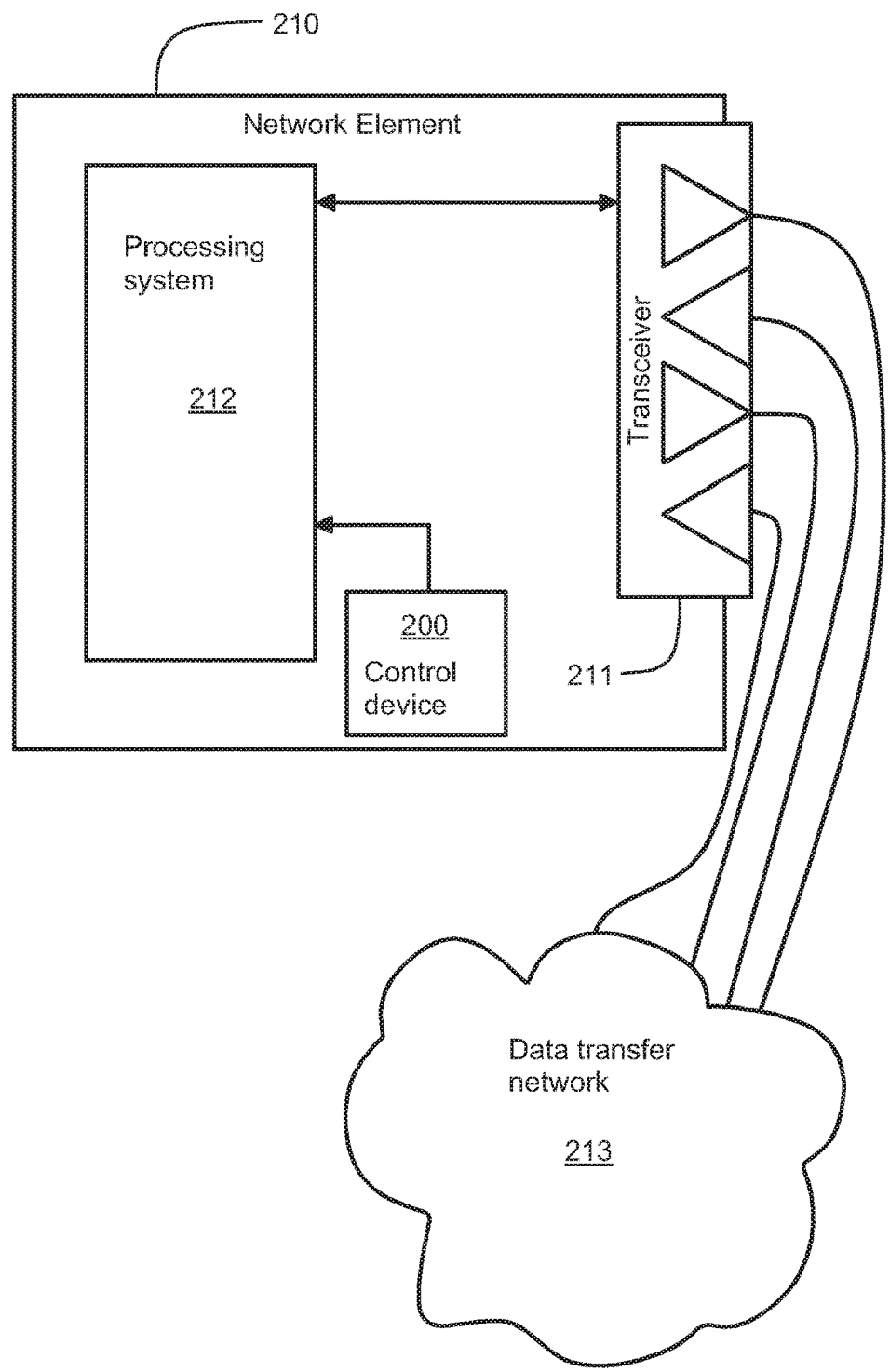
FIG. 2 shows a schematic illustration of a network element according to an exemplifying embodiment of the invention.

FIG. 2 shows a schematic illustration of a network element 210 according to an exemplifying embodiment of the invention. The network element comprises a transceiver 211 for receiving data from a data transfer network 213 and for transmitting data to the data transfer network. The network element comprises a processing system 212 for controlling the network element and for running one or more communication protocols that may comprise, for example, the Internet Protocol ("IP"), the Ethernet, the Asynchronous Transfer Mode "ATM", and/or the MultiProtocol Label Switching ("MPLS"). The network element comprises an electrical device 200 for controlling the processing system in accordance with magnetic field directed to the magnetic sensor circuitry of the electrical device. The magnetic sensor circuitry is configured to detect a direction related to a deviation of the magnetic field from the magnetic field of the earth. The above-mentioned deviation means a difference between the total magnetic field prevailing at the magnetic sensor circuitry and the magnetic field of the earth prevailing at the magnetic sensor circuitry. The electrical device 200 and/or the processing system 212 constitute a control circuitry configured to control the operation of the network element in accordance with the detected direction related to the deviation of the magnetic field from the magnetic field of the earth.

In a network element according to an exemplifying embodiment of the invention, the electrical device 200 is configured to produce a first control instruction in response to detection of a first direction related to the deviation of the magnetic field from the magnetic field of the earth. The processing system 212 is configured to control, in response to the first control instruction, the transceiver 211 to:
  send, to the data transfer network 213, a message requesting configuration data related to the one or more communication protocols, and
  receive, from the data transfer network, the configuration data.

Furthermore, the processing system 212 is configured to adapt its operation in accordance with the received configuration data.

In a network element according to an exemplifying embodiment of the invention, the electrical device 200 is configured to produce a second control instruction in response to detection of a second direction related to the deviation of the magnetic field from the magnetic field of the earth. The processing system 212 is configured to run a self-test procedure in response to the second control instruction.

In a network element according to an exemplifying embodiment of the invention, the electrical device 200 is configured to produce a third control instruction in response to detection of a third direction related to the deviation of the magnetic field from the magnetic field of the earth. The processing system 212 is configured to control, in response to the third control instruction, the network element to run a pre-determined test procedure in cooperation with external test equipment.

In a network element according to an exemplifying embodiment of the invention, the electrical device 200 is configured to produce a fourth control instruction in response to detection of a fourth direction related to the deviation of the magnetic field from the magnetic field of the earth, and the processing system 212 is configured to control, in response to fourth control instruction, the network element to be capable of operating as a part of the data transfer network 213.

The processing system 212 and/or possible logical and/or processing circuits of the electrical device 200 can be implemented with one or more programmable processor circuits, one or more dedicated hardware circuits such as an application specific integrated circuit "ASIC", one or more field programmable logic circuits such as a field programmable gate array "FPGA", or a combination of these.

Figure 3:
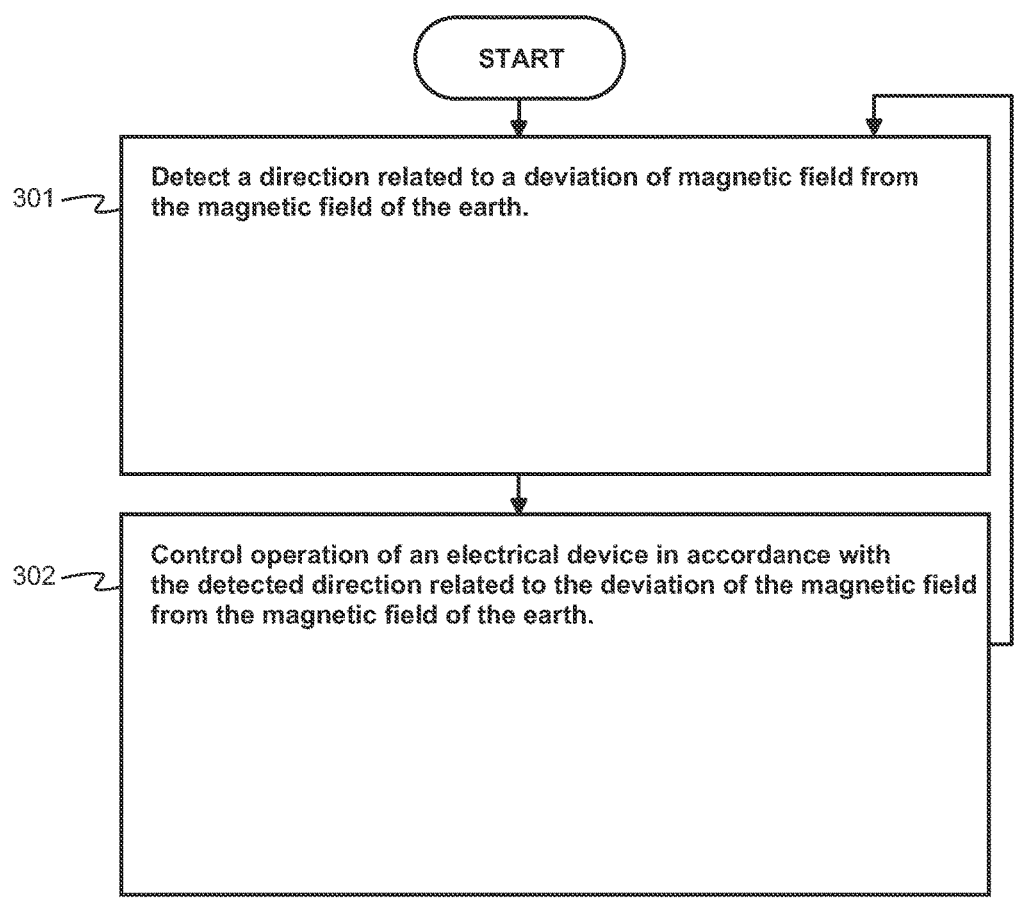
FIG. 3 shows a flow chart of a method according to an exemplifying embodiment of the invention for controlling an electrical device.

FIG. 3 shows a flow chart of a method according to an exemplifying embodiment of the invention for controlling an electrical device. The method comprises the following actions:
- action 301: detecting a direction related to a deviation of magnetic field from the magnetic field of the earth, and
- action 302: controlling the operation of the electrical device in accordance with the detected direction related to the deviation of the magnetic field from the magnetic field of the earth.

A method according to an exemplifying embodiment of the invention comprises detecting strength of the magnetic field, comparing the strength to a first threshold value, and detecting a direction of the magnetic field. A situation in which the strength of the magnetic field exceeds the first threshold value is indicative of the deviation of the magnetic field from the magnetic field of the earth and, in this case, the direction of the magnetic field can be deemed to represent the direction that is at least related to the deviation of the magnetic field from the magnetic field of the earth.

A method according to an exemplifying embodiment of the invention comprises detecting a change of the magnetic field and detecting a direction of the change of the magnetic field. The change of the magnetic field represents the deviation from the magnetic field of the earth and the direction of the change of the magnetic field represents the direction related to the deviation of the magnetic field from the magnetic field of the earth.

A method according to an exemplifying embodiment of the invention comprises detecting a vertical component of the magnetic field, comparing the vertical component to a second threshold value, and detecting a direction of the magnetic field. When the detection of the magnetic field takes place sufficiently far from the magnetic poles of the earth, a situation in which the vertical component of the magnetic field exceeds the second threshold value is indicative of the deviation of the magnetic field from the magnetic field of the earth and, in this case, the direction of the magnetic field can be deemed to represent the direction that is at least related to the deviation of the magnetic field from the magnetic field of the earth.

In method according to an exemplifying embodiment of the invention, the direction related to the deviation of the magnetic field from the magnetic field of the earth is detected with respect to a reference direction fixed to the electrical device.

A method according to an exemplifying embodiment of the invention comprises detecting orientation of the electrical device with respect to the earth and detecting the direction related to the deviation of the magnetic field from the magnetic field of the earth with respect to a reference direction fixed to the earth.

In method according to an exemplifying embodiment of the invention, at least one of the following is used for detecting the direction related to the deviation of the magnetic field from the magnetic field of the earth: a Hall-effect magnetometer and/or a magnetoresistive magnetometer.

A computer program according to an exemplifying embodiment of the invention comprises computer executable instructions for controlling a programmable processor to carry out a method according to any of the above-described exemplifying embodiments of the invention.

A computer program according to an exemplifying embodiment of the invention comprises software modules for controlling an electrical device that comprises:
- a magnetic sensor circuitry for detecting magnetic field and for generating a detection signal in response to the detected magnetic field, the magnetic sensor circuitry being configured to detect a direction related to a deviation of the magnetic field from the magnetic field of the earth, and
- a programmable processor for receiving the detection signal from the magnetic sensor circuitry.

The software modules comprise computer executable instructions for controlling the programmable processor to control the operation of the electrical device in accordance with the detected direction related to the deviation of the magnetic field from the magnetic field of the earth.

The software modules can be, for example, subroutines and functions generated with a suitable programming language.

A computer program product according to an exemplifying embodiment of the invention comprises a non-volatile computer readable medium, e.g. a compact disc ("CD"), encoded with a computer program according to an embodiment of the invention.

A signal according to an exemplifying embodiment of the invention is encoded to carry information defining a computer program according to an embodiment of the invention.

The specific examples provided in the description given above should not be construed as limiting the applicability and/or the interpretation of the appended claims.

What is claimed is:

1. A network element comprising:
   a transceiver for receiving data from a data transfer network and for transmitting data to the data transfer network,
   a processing system for controlling the network element and for running one or more communication protocols, and
   an electrical device for controlling the processing system in accordance with magnetic field directed to the electrical device, wherein the electrical device comprises:
a magnetic sensor circuitry to detect a direction of the magnetic field directed to the magnetic sensor circuitry and for detecting the magnetic field and for generating a detection signal in response to the detection of a given direction of the detected magnetic field, the magnetic sensor circuitry comprising a two-axis magnetometer or a three-axis magnetometer, and
a control circuitry configured to receive the detection signal from the magnetic sensor circuitry and to control the processing system in accordance with the detection signal,
wherein the magnetic sensor circuitry is configured to detect a direction related to a deviation of the magnetic field from the magnetic field of the earth, and the control circuitry is configured to control the processing system in accordance with the detected direction related to the deviation of the magnetic field from the magnetic field of the earth, and
wherein the electrical device is configured to produce a first control instruction in response to detection of a first direction related to the deviation of the magnetic field from the magnetic field of the earth, and the processing system is configured to control, in response to the first control instruction, the transceiver to:
i) send, out from the network element to the data transfer network, a message requesting configuration data related to the one or more communication protocols, and
ii) receive, from the data transfer network outside the network element and in response to the message requesting configuration data, the configuration data.

2. A network element according to claim 1, wherein the electrical device is configured to produce a second control instruction in response to detection of a second direction related to the deviation of the magnetic field from the magnetic field of the earth, and the processing system is configured to run a self-test procedure in response to the second control instruction.

3. A network element according to claim 1, wherein the electrical device is configured to produce a third control instruction in response to detection of a third direction related to the deviation of the magnetic field from the magnetic field of the earth, and the processing system is configured to control, in response to the third control instruction, the network element to run a pre-determined test procedure in cooperation with external test equipment.

4. A network element according to claim 1, wherein the electrical device is configured to produce a fourth control instruction in response to detection of a fourth direction related to the deviation of the magnetic field from the magnetic field of the earth, and the processing system is configured to control, in response to the fourth control instruction, the network element to be capable of operating as a part of the data transfer network.

5. A network element according to claim 1, wherein the one or more communication protocols comprise at least one of the following: Internet Protocol ("IP"), Ethernet, asynchronous transfer mode ("ATM"), MultiProtocol Label Switching ("MPLS").

* * * * *